(12) United States Patent
Allen et al.

(10) Patent No.: US 8,219,365 B2
(45) Date of Patent: Jul. 10, 2012

(54) METHOD OF DESIGNING A MOTOR VEHICLE

(75) Inventors: Brian T. Allen, Hilliard, OH (US); Christopher Mampe, Delaware, OH (US); Peter Cardimen, Powell, OH (US); Skye Malcolm, Upper Arlington, OH (US)

(73) Assignee: Honda Motor Co., Ltd., Tokyo (JP)

( * ) Notice: Subject to any disclaimer, the term of this patent is extended or adjusted under 35 U.S.C. 154(b) by 551 days.

(21) Appl. No.: 12/403,889

(22) Filed: Mar. 13, 2009

(65) Prior Publication Data
US 2010/0235149 A1 Sep. 16, 2010

(51) Int. Cl.
*G06F 7/60* (2006.01)
*G06F 17/10* (2006.01)

(52) U.S. Cl. .......................................................... 703/2

(58) Field of Classification Search ... 703/2; 280/728.1, 280/735
See application file for complete search history.

(56) References Cited

U.S. PATENT DOCUMENTS

| | | | |
|---|---|---|---|
| 5,251,161 A | 10/1993 | Gioutsos et al. | |
| 5,345,402 A | 9/1994 | Gioutsos et al. | |
| 5,729,463 A * | 3/1998 | Koenig et al. | 700/98 |
| 5,868,423 A * | 2/1999 | Takimoto et al. | 280/735 |
| 6,721,642 B1 | 4/2004 | Wu et al. | |
| 6,907,391 B2 | 6/2005 | Bellora et al. | |
| 2007/0251295 A1 * | 11/2007 | Rieser et al. | 73/12.07 |
| 2009/0143943 A1 * | 6/2009 | Jaramillo et al. | 701/45 |

OTHER PUBLICATIONS

Kirkpatrick, Develpoment and Validation of High Fidelity Vehicle Crash Simulation Models, Mar. 2000, SAE, pp. 1-10.*
Zou et al., Simulation of Truck Rear Underrun Barrier Impact, 2001, 17th International Technical Conference on the Enhanced Safety of Vehicles, pp. 1-7.*
Suri Bala, Built-In Filtered Nodal Acceleration Output Using IACCOP in *Control_Output, d3VIEW Blog, Sep. 10, 2006, available at http://blog.d3view.com/2006/09/18/built-in-filtered-nodal-acceleration-output-using-iaccop-in-controll_output/ (Accessed Aug. 5, 2009).
Jacob, Use of *SSENOR in LS-DYNA971, d3 VIEW Blog, Sep. 10, 2006, available at http://blog.d3view.com/2006/09/10/use-of-sensor-in-ls-dyna-971/ (Accessed Aug. 5, 2009).
Dilip Bhalsod, Recent Developments in LS-DYNAh Annual HP Symposium, Apr. 3, 2007, available at https://h30406.www3.hp.com/campaigns/2007/events/caesymposium/images/LSTC_DilipBhalsod_Symposium07.pdf (Accessed Aug. 5, 2009).
Masahiro Awano, Abstract of an Example of Evolution Procedure for Frontal Airbag Sensor Response by CAE, Japan LS-DYNA Users Week 2006, Sep. 19, 2006, available at http://ls-dyna.jri-sol.co.jp/en/event/dynal_summary2006.html (Accessed Aug. 5, 2009) (Abstract in question called out by the Applicant with an asterisk in the attached document).

* cited by examiner

*Primary Examiner* — Dwin M Craig
*Assistant Examiner* — Bernard E Cothran
(74) *Attorney, Agent, or Firm* — Plumsea Law Group, LLC (57) ABSTRACT

A method of designing a motor vehicle is disclosed. The method includes simulating a collision of a motor vehicle using a computer model that corresponds to the motor vehicle. Collision data is collected from the simulation and used to determine calibration information for an air bag system.

23 Claims, 11 Drawing Sheets

METHOD OF DESIGNING A MOTOR VEHICLE

BACKGROUND OF THE INVENTION

1. Field of the Invention

The present invention relates generally to motor vehicles and in particular to a method of designing a motor vehicle using a simulation system.

2. Description of Related Art

Generally, a motor vehicle may be required to meet Federal Motor Vehicle Safety Standards (FMVSS). In order to meet these safety standards, one or more safety systems in a motor vehicle can be tested during a crash test. As an example, motor vehicles may include air bag systems that deploy during a collision. A manufacturer may conduct a crash test to check compliance of air bags with one or more safety standards.

To detect a collision, a motor vehicle can include one or more sensors that are configured to detect acceleration information to determine if a collision has occurred. This acceleration information can be used to determine a calibration setting for the air bag system. In some cases, the calibration setting determines if the air bag system will fire. The calibration setting can also ensure that the air bag is deployed within a desired time frame, also referred to as a target time to fire (TTTF), during a collision. Methods of calibrating an air bag system for a motor vehicle typically require a manufacturer or part supplier to conduct a full scale collision to measure acceleration information during the collision.

In some cases, a manufacturer may conduct a motor vehicle collision in which a motor vehicle collides with another object. During the collision, the manufacturer may measure the accelerations experienced at one or more sensors during a collision. With this acceleration data, a manufacturer or part supplier may calibrate an air bag system to ensure that the air bag is deployed within a target time to fire during such a collision. However, this method requires a new motor vehicle to be constructed in order to perform the collision for the purpose of determining calibration information, which can increase manufacturing time and manufacturing costs.

The related art lacks provisions for decreasing the manufacturing costs and time associated with calibrating an air bag system. Furthermore, the related art lacks provisions that allow the design of a motor vehicle to be modified in order to optimize the calibration of an air bag system. There is a need in the art for a method that helps decrease manufacturing costs and development cycle time associated with calibration of an air bag system. There is also a need in the art for a method that optimizes the calibration of an air bag system.

SUMMARY OF THE INVENTION

A method of designing a motor vehicle is disclosed. The invention can be used in connection with a motor vehicle. The term "motor vehicle" as used throughout the specification and claims refers to any moving vehicle that is capable of carrying one or more human occupants and is powered by any form of energy. The term motor vehicle includes, but is not limited to cars, trucks, vans, minivans, SUVs, motorcycles, scooters, boats, personal watercraft, and aircraft.

In some cases, the motor vehicle includes one or more engines. The term "engine" as used throughout the specification and claims refers to any device or machine that is capable of converting energy. In some cases, potential energy is converted to kinetic energy. For example, energy conversion can include a situation where the chemical potential energy of a fuel or fuel cell is converted into rotational kinetic energy or where electrical potential energy is converted into rotational kinetic energy. Engines can also include provisions for converting kinetic energy into potential energy. For example, some engines include regenerative braking systems where kinetic energy from a drivetrain is converted into potential energy. Engines can also include devices that convert solar or nuclear energy into another form of energy. Some examples of engines include, but are not limited to: internal combustion engines, electric motors, solar energy converters, turbines, nuclear power plants, and hybrid systems that combine two or more different types of energy conversion processes.

In one aspect, the invention provides a method of designing a motor vehicle, comprising the steps of: simulating a motor vehicle collision using a computer model; receiving collision data from the simulated collision; receiving calibration information for a motor vehicle system, the calibration information being determined from the collision data; stepping through the collision data to determine at least one modification to the computer model according to the calibration information; modifying the computer model to create a modified computer model; and re-simulating the motor vehicle collision using the modified computer model.

In another aspect, the invention provides a method of designing a motor vehicle, comprising the steps of: simulating a motor vehicle collision using a computer model; receiving collision data from the simulated collision; and determining calibration information for a motor vehicle system, the calibration information being determined from the collision data.

In another aspect, the invention provides a method of designing a motor vehicle, comprising the steps of: simulating a motor vehicle collision using a computer model; receiving collision data from the simulated collision; receiving calibration information for a motor vehicle system, the calibration information being determined from the collision data; stepping through the collision data to determine at least one modification to the computer model according to the calibration information; modifying the computer model to create a modified computer model; and re-simulating the motor vehicle collision using the modified computer model.

In another aspect, the invention provides a method of designing a motor vehicle, comprising the steps of: simulating a motor vehicle collision using a computer model; receiving collision data from the simulated collision; and determining optimized sensor locations according to the collision data.

Other systems, methods, features and advantages of the invention will be, or will become, apparent to one of ordinary skill in the art upon examination of the following figures and detailed description. It is intended that all such additional systems, methods, features and advantages be included within this description and this summary, be within the scope of the invention, and be protected by the following claims.

BRIEF DESCRIPTION OF THE DRAWINGS

The invention can be better understood with reference to the following drawings and description. The components in the figures are not necessarily to scale, emphasis instead being placed upon illustrating the principles of the invention. Moreover, in the figures, like reference numerals designate corresponding parts throughout the different views.

DETAILED DESCRIPTION OF THE EXEMPLARY EMBODIMENTS

Figure 1:
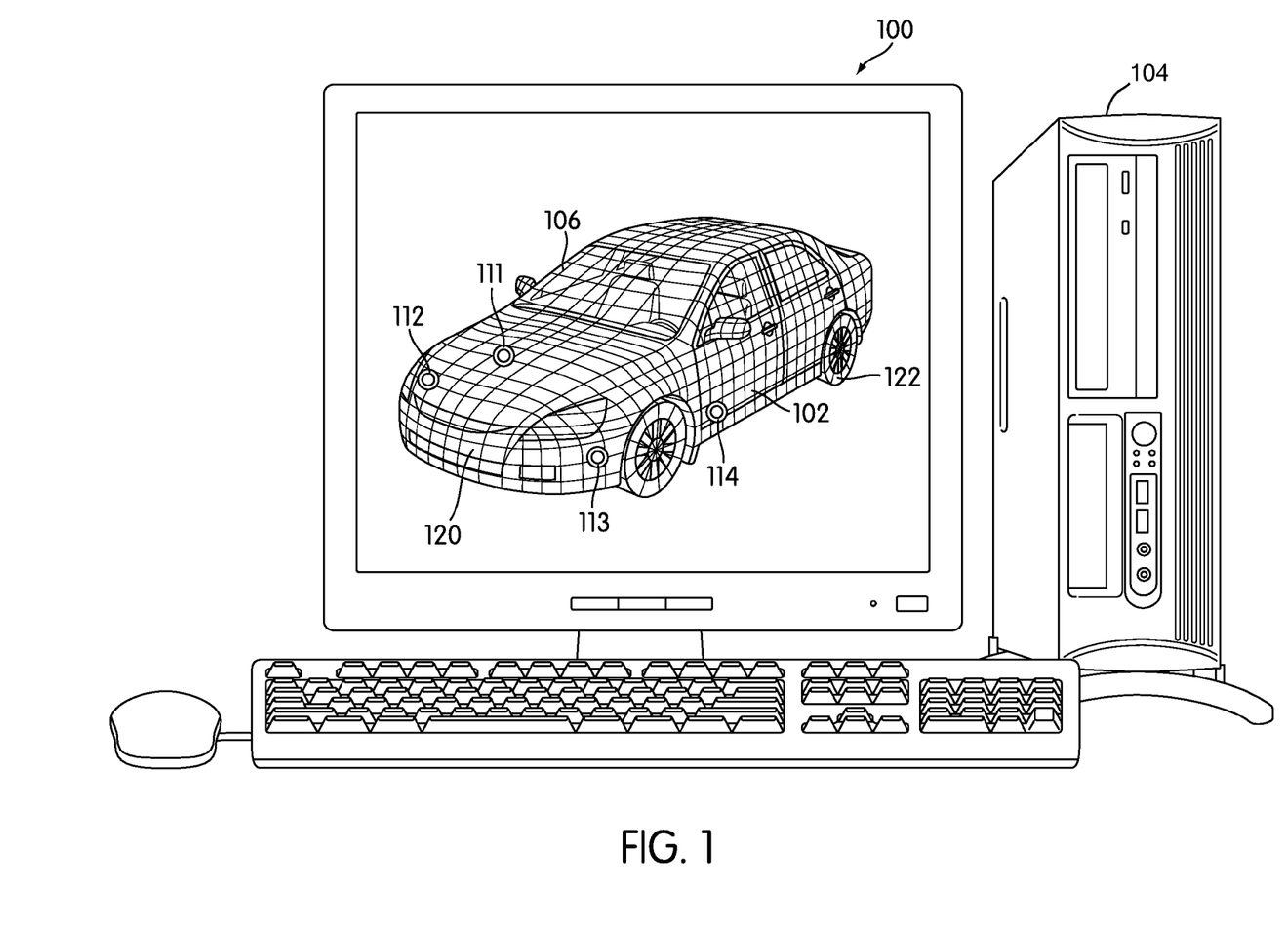
FIG. 1 is a schematic view of an embodiment of a simulation system.

FIG. 1 is a schematic diagram of an illustrative embodiment of simulation system 100. In some embodiments, simulation system 100 includes computer 104. Generally, computer 104 may be any device capable of reading and executing a set of instructions in the form of software. In some cases, computer 104 can include a CPU, memory, as well as input and output devices, such as a mouse, a keyboard and a monitor. Computer 104 may be configured to read in software instructions from any type of computer readable medium including, but not limited to, CD-ROMs, floppy disks, magnetic tapes, solid-state memories as well as other types of computer readable medium.

In this embodiment, computer 104 is illustrated as a personal desktop computer. However, in other embodiments, computer 104 could be any other type of computer. For example, in another embodiment, computer 104 could be a supercomputer. Furthermore, in other embodiments, computer 104 could be networked with multiple computers in order to facilitate parallel processing.

Simulation system 100 may include computer model 102. In the current embodiment, computer model 102 has the form of a motor vehicle. The term motor vehicle includes, but is not limited to cars, trucks, vans, minivans, SUVs, motorcycles, scooters, boats, personal watercraft, and aircraft. In an exemplary embodiment, computer model 102 is a sedan type motor vehicle. In still other embodiments, computer model 102 could have the form of another type of machine or device. In other words, in another embodiment, computer model 102 may not be a motor vehicle.

Simulation system 100 may include provisions for modeling various aspects of a motor vehicle using computer model 102. For example, in some cases, simulation system 100 can be used to model the structural design of a motor vehicle. In other cases, simulation system 100 can be used to model the motion of a motor vehicle. In still other cases, simulation system 100 can be used to model other aspects of a motor vehicle including, but not limited to, weight, load bearing characteristics, stress characteristics, strain characteristics, as well as other features.

Generally, any method known in the art for modeling one or more characteristics of a motor vehicle may be used in cooperation with simulation system 100. In some embodiments, a computer model for simulating properties of a motor vehicle may be a stochastic model that incorporates probabilities. In other embodiments, the model may be a deterministic model, including chaotic models. Furthermore, in some cases, the model may be a continuous model. In other cases, the model may be a discrete model.

In one embodiment, simulation system 100 may be configured as a finite element analysis (FEA) method for modeling one or more characteristics of a motor vehicle. In particular, computer model 102 may comprise a predetermined and finite number of elements that are configured to interact with one another according to various physical laws that dictate the motion and material characteristics of each element.

Computer model 102 may comprise a plurality of finite elements 106. The term "finite element" is used throughout this detailed description and in the claims refers to a finite portion of a computer model that is associated with one or more material properties. Examples of material properties that could be associated with each finite element include mass, volume, stress properties, strain properties, as well as other material properties. In addition to material properties, each finite element could be associated with dynamic properties. Examples of dynamic properties include, but are not limited to, velocity, momentum, acceleration as well as other properties.

By applying various algorithms using simulation system 100, each of the plurality of finite elements 106 may be configured to interact with one another according to various physical laws. In some cases, each finite element may be configured to experience forces applied by adjacent finite elements according to the usual laws of Newtonian mechanics. For example, as an external force is applied to one end of a computer model, the simulation may determine how the force is distributed throughout the computer model as each finite element acts on adjacent finite elements according to usual physical principles.

For purposes of illustration, each of the plurality of finite elements 106 is illustrated as a substantially rectangular element. However, in other embodiments, an element could have any other shape including, but not limited to, circular, elliptical, square, polygonal, regular or an irregular shape. The shape of a finite element may be selected according to the particular features of a computer model.

In different embodiments, the size of one or more finite elements can vary. In some cases, the plurality of finite elements 106 may have a substantially uniform size. In other cases, the sizes of finite elements can vary. In some embodiments, the size of the finite elements, also referred to as the "mesh size," can be chosen according to a predetermined accuracy. In some cases, smaller mesh sizes can be used to increase the accuracy of a simulation system. However, the computational power required to run the simulation may also grow as the mesh size shrinks, which may require additional time and expense. Therefore, a mesh size may be selected for a simulation system that provides a balance between accuracy and computational power.

Plurality of finite elements 106 may be arranged into one or more meshes. The term "mesh" as used throughout this detailed description and in the claims refers to any collection of finite elements that can be associated with a particular portion of a motor vehicle. In some cases, a mesh may be a collection of finite elements with substantially similar material properties. In other cases, a mesh may be a collection of finite elements that correspond to a distinct component of a motor vehicle. For example, in some cases, a body panel of a motor vehicle can be modeled by using a body mesh that comprises a set of finite elements with material properties similar to the body panel. Additionally, a frame of a motor vehicle can be modeled with a frame mesh in order to properly simulate the structural characteristics of the frame.

In this exemplary embodiment, computer model 102 may comprise one or more meshes. In some cases, computer model 102 may comprise body mesh 120. Generally, body mesh 120 can be used to model any number of body panels for a motor vehicle. Computer model 102 may also include tire mesh 122. In some cases, tire mesh 122 can comprise a collection of finite elements that are used to model the structure and behavior of a set of tires of a motor vehicle. Additionally, computer model 102 may include meshes associated with interior structural features of a motor vehicle.

In some embodiments, a computer model may be provided with detailed portions that correspond to various portions of a motor vehicle. For example, a door in a computer model could include body panel portions, frame portions, cross beam portions, padding portions, as well as other portions. In some cases, these portions may be constructed of distinct meshes. In other cases, multiple distinct portions may be constructed as a single mesh. With this arrangement, the computer model may be configured to accurately simulate the effects of an impact on a portion of a motor vehicle, such as a vehicle door.

Figure 2:
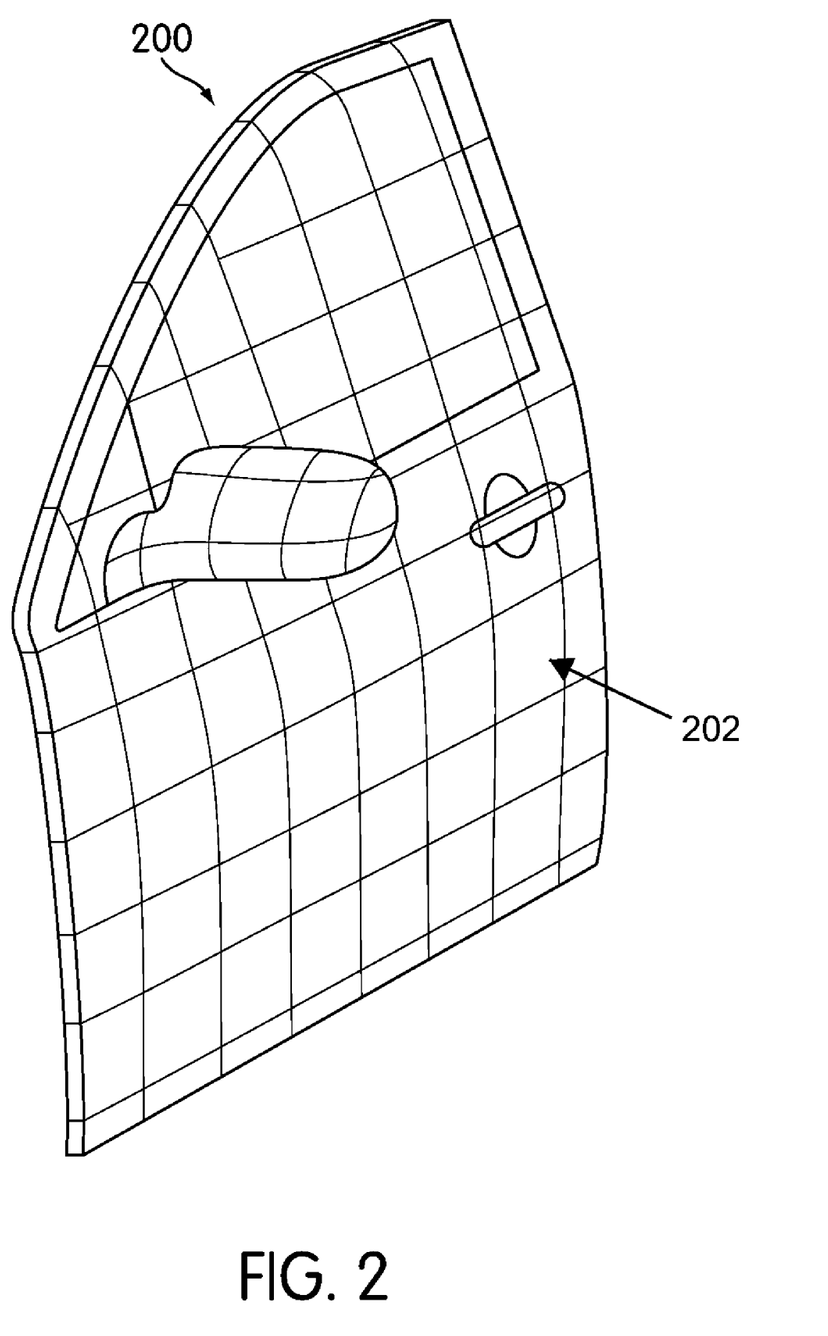
FIG. 2 is a schematic view of an embodiment of a door of a computer model.
Figure 3:
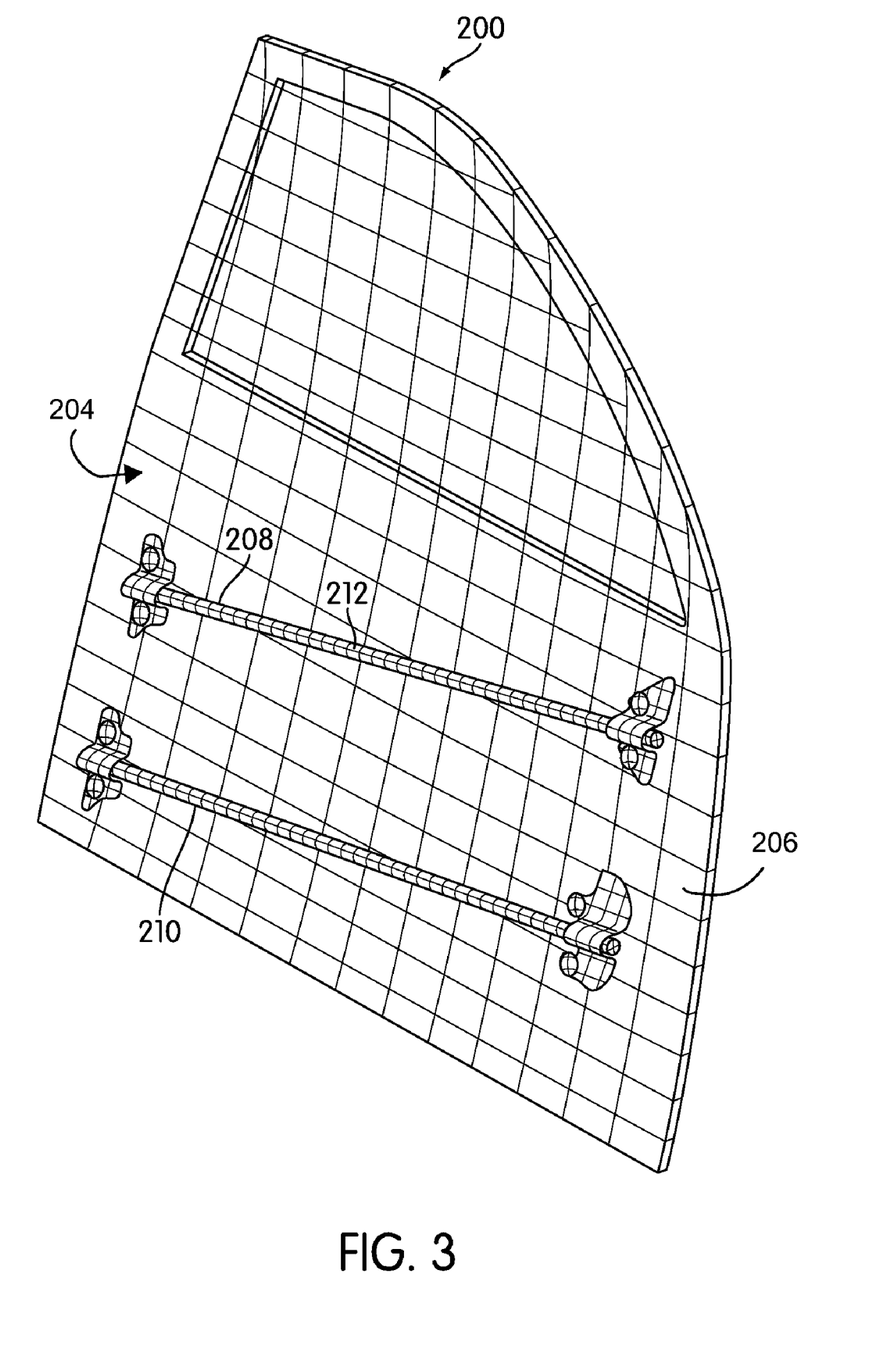
FIG. 3 is a schematic view of an embodiment of a door of a computer model.

FIG. 2 illustrates a schematic view of outer portion 202 of door 200 of computer model 102. FIG. 3 illustrates a schematic view of inner portion 204 of door 200. Referring to FIGS. 2 and 3, door 200 can be provided with various portions that correspond to portions in the door of a motor vehicle. For example, door 200 can include body paneling 206. Likewise, door 200 can include one or more cross beams. In one embodiment, door 200 may include first cross beam 208 and second cross beam 210. In some cases, body paneling 206, first cross beam 208 and second cross beam 210 may all be made of distinct meshes. In particular, intermediate portions 212 of first cross beam 208 and second cross beam 210 may be spaced apart from door 200 in order to accurately represent the construction of a motor vehicle door. Although the current embodiment includes two cross beams, it should be understood that other embodiments may only include a single cross beam.

For purposes of clarity, only a few portions of a door are illustrated in this embodiment. However, it should be understood that in other embodiments, other portions of a motor vehicle door could be included with computer model 102. Examples of other portions that could be used include, but are not limited to, pads, beams, interior paneling, handle bars, power control systems such as power doors and/or power windows, as well as other portions. In other embodiments, any portion of the vehicle body could also be included with computer model 102.

Although FIGS. 2 and 3 illustrate an embodiment of a door for a computer model, in other embodiments computer model 102 can also include other portions of a body of a motor vehicle. Generally, any portion of a motor vehicle can be included as part of computer model 102. In some cases, a computer model can be configured with detailed portions corresponding to a frame of a motor vehicle. In other cases, a computer model can be configured with detailed portions corresponding to a body of a motor vehicle. In still other cases, a computer model can be configured with detailed portions corresponding to various components of a motor vehicle such as, but not limited to, an engine, a transmission, a steering system, a brake system, as well as other components or systems.

Typically, a motor vehicle may include one or more sensors that are capable of detecting collisions. These sensors can transmit information related to the collision to one or more motor vehicle systems. For example, the sensors can transmit information to an air bag system (ABS). When the air bag system receives information about a collision occurring, the air bag system can be configured to deploy one or more air bags. The number and location of deployed airbags can vary according to information received from the one or more collision sensors.

In embodiments where a motor vehicle may be equipped with one or more collision sensors, a simulation system can include provisions for simulating a collision in order to determine calibration information for one or more motor vehicle systems. In some cases, a computer model can be provided with one or more predetermined regions that correspond to the locations of one or more sensors in a motor vehicle. During a simulated collision, collision data can be collected at the one or more predetermined regions. This configuration simulates the collection of real collision data from sensors during an actual motor vehicle crash test.

Referring back to FIG. 1, computer model 102 may be provided with one or more predetermined sensor regions that correspond to the locations of one or more sensors on a motor vehicle. Generally, any number and pattern of predetermined sensor regions can be used to simulate the corresponding sensor array of a motor vehicle. In some cases, computer model 102 can include at least one predetermined sensor region. In other cases, computer model 102 can include two or more predetermined sensor regions. In an exemplary embodiment, computer model 102 may include four predetermined sensor regions. In particular, computer model 102 may include first predetermined sensor region 111, second predetermined sensor region 112, third predetermined sensor region 113 and fourth predetermined sensor region 114.

For purposes of illustration, each of the predetermined sensor regions is represented as a circle. In other embodiments, the size and/or shape of each predetermined sensor region could vary. Furthermore, first predetermined sensor region 111, second predetermined sensor region 112, third predetermined sensor region 113 and fourth predetermined sensor region 114 are disposed in body mesh 120 of computer model 102. In other embodiments, however, the location of each predetermined sensor region could vary. In other cases, one or more predetermined sensor regions could be associated with any other portion of computer model 102 including a cabin portion, a door portion, a floor portion, a roof portion, a trunk portion, a hood portion or any other portion.

In some embodiments, a predetermined sensor region of computer model 102 may comprise a collection of finite elements that are configured to model a sensor. In other embodiments, however, a predetermined sensor region may be a generalized location of computer model 102 that corresponds to the location of a sensor in a motor vehicle. Furthermore, it should be understood that a simulation system may be configured to calculate, or otherwise determine, acceleration data throughout the entire computer model. In particular, the simulation system may be configured to determine acceleration data at more regions of the computer model than the predetermined sensor regions.

In some embodiments, a simulation system can be used to determine optimized sensor locations according to acceleration data determined during a collision. In other words, using acceleration data gathered during a collision, the simulation system can determine the sensor locations that give optimal information about various types of collision. For example, the simulation system can determine the sensor locations that provide optimal information during a side impact collision. In some cases, the simulation system can determine optimized sensor locations for a motor vehicle during an optional pre-step prior to using the simulation system to model other aspects of a motor vehicle. In other cases, however, the sensor locations can be determined in another manner without using information from the simulation system. For example, the sensor locations for a particular type of motor vehicle can be determined according to manufacturing requirements in some situations.

Figure 4:
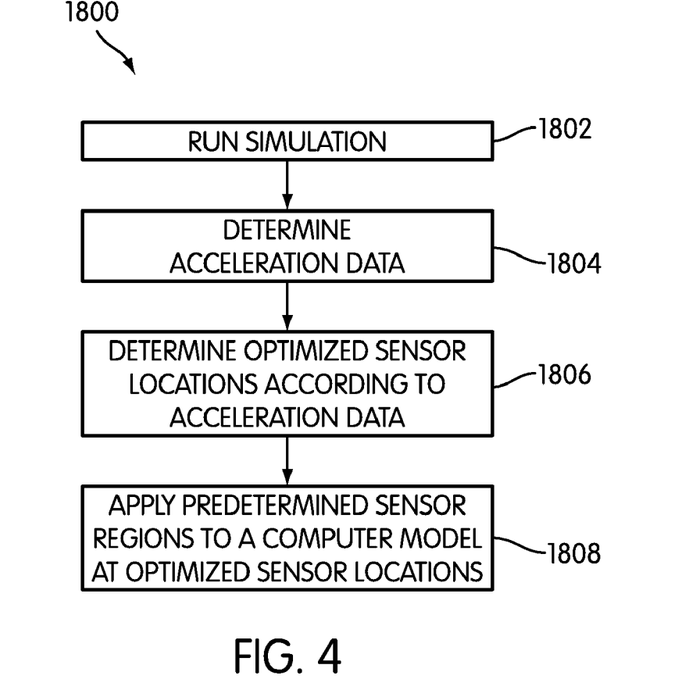
FIG. 4 is a schematic view of an embodiment of a process for determining optimized sensor locations according to acceleration information.

FIG. 4 is a schematic view of an embodiment of process 1800 for determining optimized sensor locations. In some cases, some of these steps may be performed by a manufacturer. Generally, the term manufacturer, as used here, may also refer to distributors and/or suppliers. In addition, the term manufacturer can include designers of a motor vehicle or of a component of a motor vehicle. In other words, the term manufacturing may also apply to various operations including the operations responsible for design, parts, labor, and/or retail of a motor vehicle associated with a simulation system, as well as other manufacturing side operations.

During first step 1802, a simulation system with a computer model can be run. As a collision is simulated, acceleration data may be determined during second step 1804. As previously discussed, the simulation system may be configured to calculate, or otherwise determine, acceleration data throughout the entire computer model. Details of the determination of acceleration data will be discussed later in this detailed description.

Following second step 1804, optimized sensor locations may be determined according to acceleration data determined from computer model during third step 1806. This can be accomplished by determining sensor locations that are most responsive in measuring acceleration changes during a simulated collision. In some embodiments, a manufacturer can manually determine optimized sensor locations by observing acceleration data generated by the simulation system. In other embodiments, a simulation system may be configured to automatically determine optimized sensor locations from acceleration data. In some cases, optimized sensor locations may be selected from a pre-defined set of possible sensor locations. For example, manufacturing constraints may limit sensor locations to a pre-defined set of possible sensor locations. In other cases, optimized sensor locations may be selected solely according to acceleration data.

After third step 1806, predetermined sensor regions may be applied to a computer model at the optimized sensor locations. This arrangement allows the computer model to simulate a sensor array disposed at the optimized sensor locations on a motor vehicle. With this arrangement, process 1800 may be run as an optional pre-step before using the simulation system to model other aspects of the motor vehicle.

Figure 5:
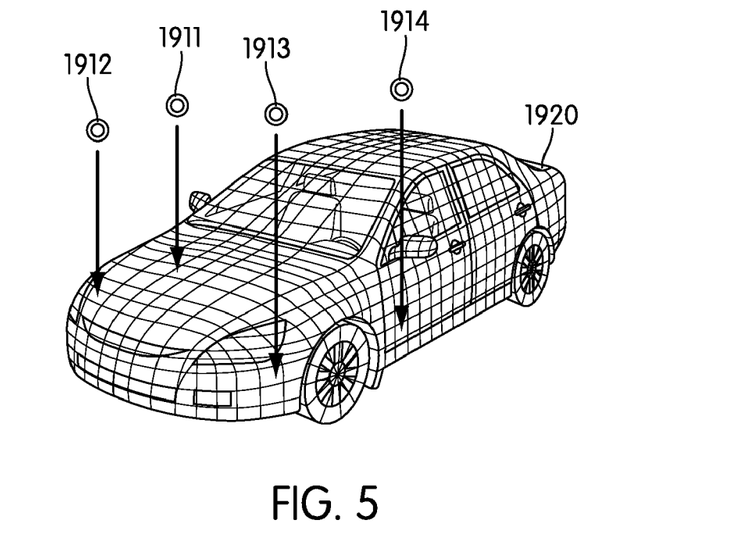
FIG. 5 is a schematic view of an embodiment of a computer model with predetermined sensor regions disposed in optimized sensor locations according to acceleration information.

FIG. 5 is a schematic view of an embodiment of computer model 1920. In some embodiments, computer model 1920 may represent a motor vehicle. In some cases, computer model 1920 may be substantially similar to computer model 102. However, in other embodiments, computer model 1920 may not be a motor vehicle.

In one embodiment, four optimized sensor locations may be determined according to acceleration data from a simulation with computer model 1920. In other embodiments, more or less than four optimized sensors locations may be determined according to acceleration data. Furthermore, it should be understood that an unlimited number of possible configurations of optimized sensor locations may be determined by acceleration data from a simulation with computer model 1920. In some cases, the number of possible configurations of optimized sensors locations may be limited by details of manufacturing a motor vehicle represented by computer model 1920.

Following the determination of four optimized sensor locations, four predetermined sensor regions may be associated with computer model 1920 at the four optimized sensor locations. In particular, computer model 1920 may be associated with first predetermined sensor region 1911, second predetermined sensor region 1912, third predetermined sensor region 1913 and fourth predetermined sensor region 1914. This arrangement allows computer model 1920 to simulate a sensor array disposed at the four optimized sensor locations on a motor vehicle.

Figure 6:
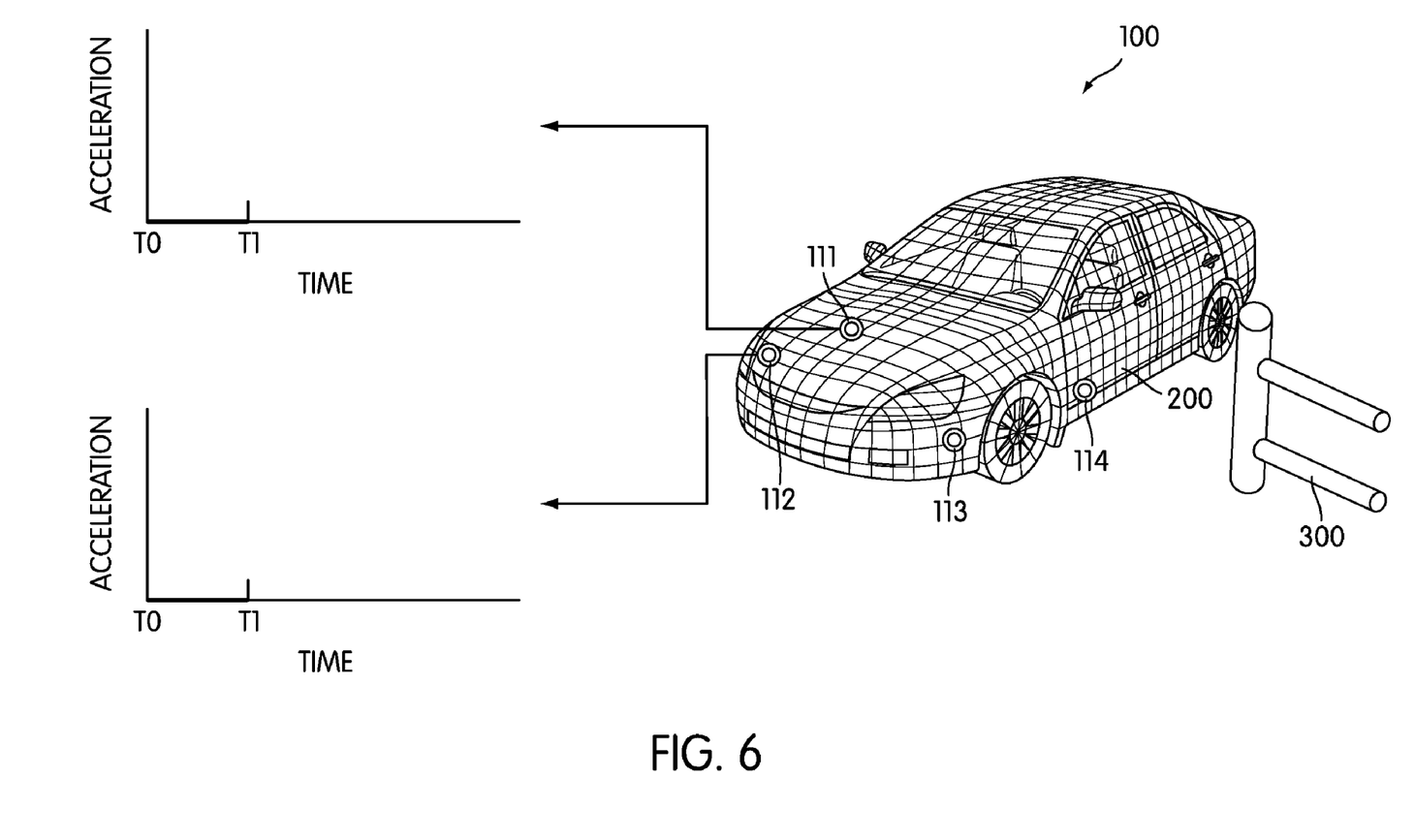
FIG. 6 is a schematic view of an embodiment of acceleration curves associated with a simulation.
Figure 7:
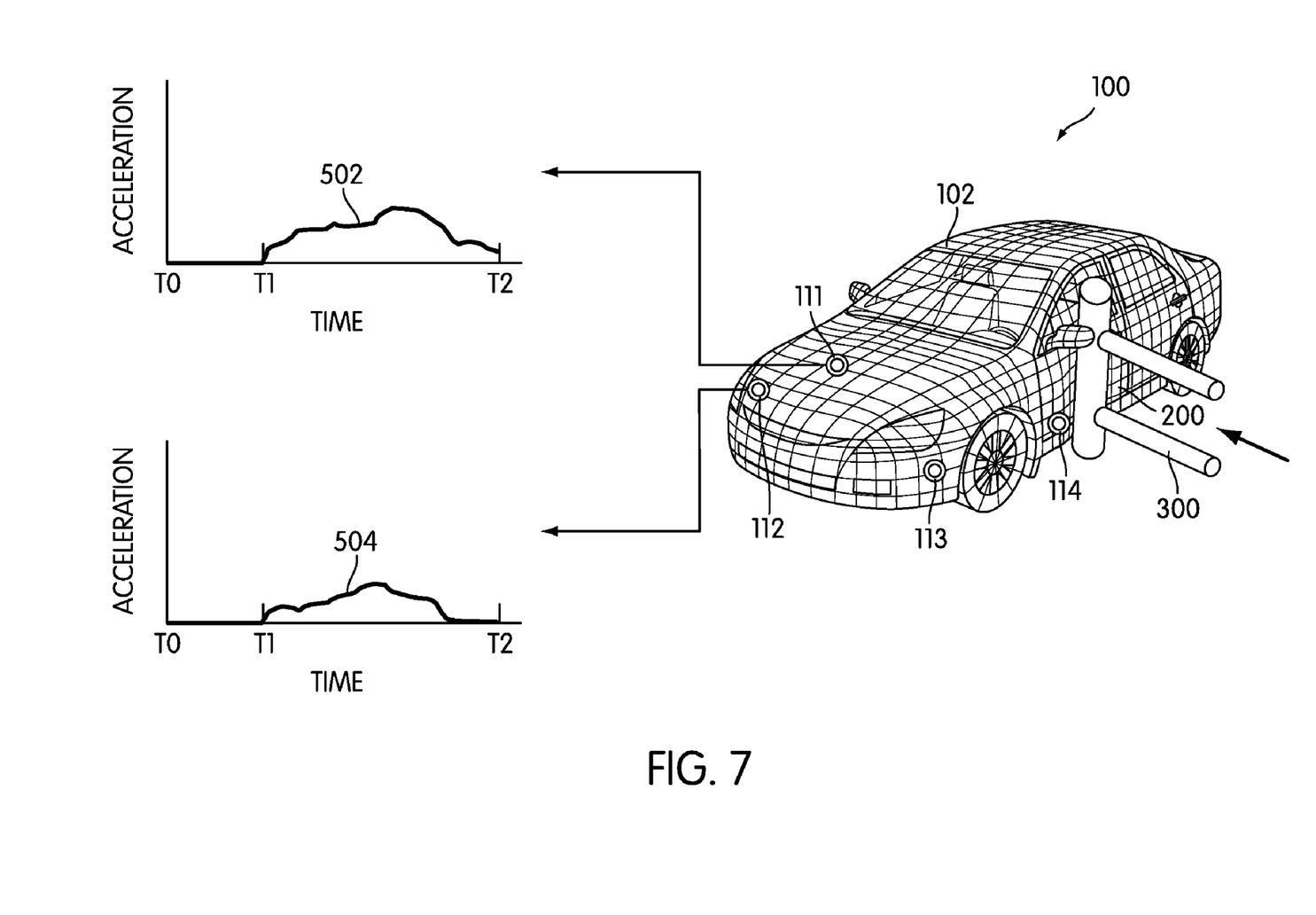
FIG. 7 is a schematic view of an embodiment of acceleration curves associated with a simulation.

FIGS. 6 and 7 illustrate an embodiment of a simulated collision using simulation system 100. In this exemplary embodiment, computer model 102 is kept at rest while pole 300 is accelerated into door 200. In one embodiment, pole 300 may be accelerated into door 200 at approximately 32 km/hr. In some cases, pole 300 may be directed along an angle with respect to computer model 102. In an exemplary embodiment, pole 300 may be oriented at an angle in the range between seventy degrees and eighty degrees. This arrangement is configured to simulate a side lateral collision with an object such as a pole or other objects that could potentially impact a side door during a collision.

Throughout the duration of the collision, various types of collision data may be monitored throughout computer model 102. In some cases, acceleration data may be monitored throughout computer model 102. In some cases, acceleration data can be measured and recorded for each finite element within computer model 102. In other cases, acceleration information can be measured and recorded only at some portions of computer model 102. In an exemplary embodiment, acceleration data may be measured and recorded at first predetermined sensor region 111, second predetermined sensor region 112, third predetermined sensor region 113 and fourth predetermined sensor region 114. With this arrangement, acceleration data can be determined in regions that correspond to the locations of collision sensors in a motor vehicle.

Referring to FIG. 6, prior to a collision between pole 300 and computer model 102, acceleration measured at each predetermined sensor region may be zero, as computer model 102 is not in motion. In particular, first predetermined sensor region 111 may be associated with zero acceleration between time T0 and time T1. Additionally, second predetermined sensor region 112 may be associated with zero acceleration between time T0 and time T1. For purposes of clarity, only the acceleration data measured at first predetermined sensor region 111 and second predetermined sensor region 112 are shown. However, it should be understood that third predetermined sensor region 113 and fourth predetermined sensor region 114 may also be associated with acceleration data. In this case, the acceleration data measured at third predetermined sensor region 113 and fourth predetermined sensor region 114 is also zero between time T0 and time T1.

Referring to FIG. 7, pole 300 may collide with computer model 102. Specifically, pole 300 may collide with door 200 of computer model 102. In this embodiment, first acceleration curve 502 is indicative of the accelerations experienced at first predetermined sensor region 111 during the interval between time T1 and time T2. Likewise, second acceleration curve 504 is indicative of the accelerations experienced at second predetermined sensor region 112 during the interval between time T1 and time T2. In this case, the beginning of the collision occurs at time T1. Likewise, the end of the collision occurs at time T2. As indicated by first acceleration curve 502 and second acceleration curve 504, the accelerations experienced during the time interval T1 to T2 is nonzero, indicating that first predetermined sensor region 111 and second predetermined sensor region 112 experience sudden forces during this time interval.

In embodiments where collision sensors are not located on a door of a motor vehicle, acceleration data from various sensors in other portions of a motor vehicle can be used to determine the accelerations experienced at the door. For example, in one embodiment, acceleration data from first predetermined sensor region 111 and second predetermined sensor region 112 may be used to determine acceleration data experienced at door 200 of computer model 102. In other embodiments, acceleration data from third predetermined sensor region 113 and fourth predetermined sensor region 114 could also be used to determine acceleration data for other portions of computer model 102.

Figure 8:
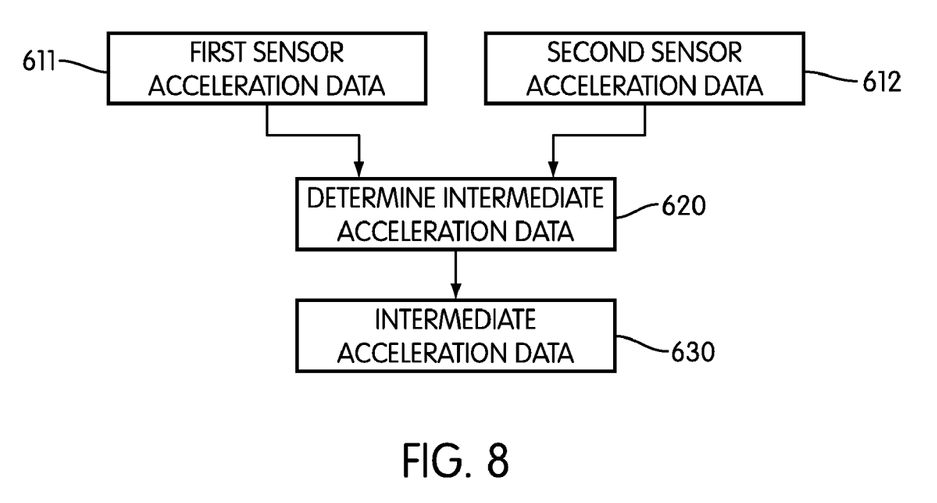
FIG. 8 is a schematic view of an embodiment of a process for determining acceleration data at a predetermined location.

FIG. 8 illustrates a schematic view of an embodiment of a process for determining acceleration data at a predetermined portion of computer model 102 using acceleration data from one or more predetermined sensor regions. In some cases, the predetermined location may be spaced apart from the predetermined sensor regions. In such cases, it may be necessary to determine acceleration data at the predetermined location according to acceleration data received at one or more predetermined sensor regions. For example, in the current embodiment predetermined sensor regions are associated with a front of the computer model. However, a side impact collision occurs at a door of the computer model. Therefore, the current method uses acceleration information generated at the predetermined sensor locations to approximately determine the acceleration information experienced at the door of the computer model. With this arrangement, during a full scale collision, an air bag system can be calibrated according to acceleration data received at sensors that may be located away from the location of the collision.

In this embodiment, first sensor acceleration data 611 and second sensor acceleration data 612 may be inputs to process 620. Generally, process 620 can be any calculation, method or other type of process for determining acceleration data at a predetermined portion according to acceleration data from one or more predetermined sensor regions. In one embodiment, process 620 could be a set of calculations. In some embodiments, the output of process 620 may be acceleration data 630 for a predetermined location or portion of a computer model.

Generally, any method can be used for determining acceleration data at a predetermined location from acceleration data measured at predetermined sensor regions. In some cases, interpolation methods can be used to determine acceleration data at a predetermined location. The term "interpolation" refers to a method of creating new data within a known range of data points. Examples of interpolation methods include, but are not limited to, linear interpolation and polynomial interpolation. In other cases, extrapolation methods can be used to determine acceleration data at a predetermined location. The term "extrapolation" refers to a method of creating new data outside of a known range of data points. Examples of extrapolation methods include, but are not limited to, linear extrapolation and polynomial extrapolation.

In some embodiments, acceleration data from computer model 102 can be used to determine calibration settings for an air bag system. In some cases, acceleration data can be submitted to a supplier of an air bag system. In other cases, the acceleration data can be analyzed by the manufacturer to determine calibration settings for the air bag system.

Figure 9:
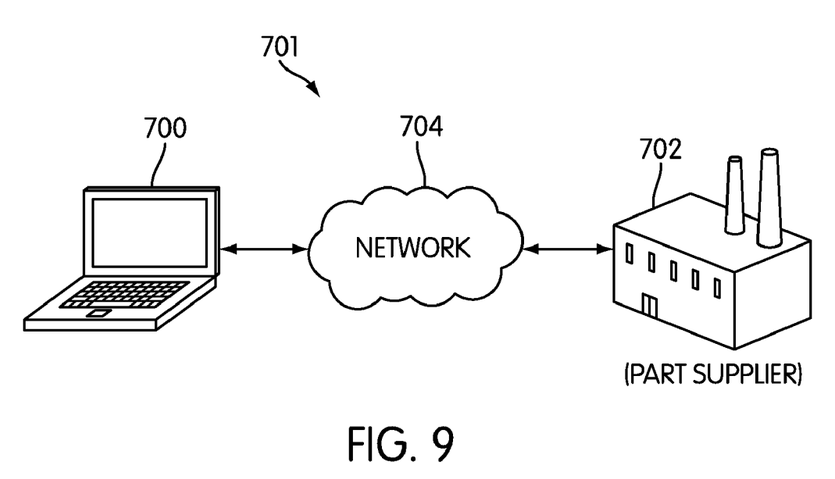
FIG. 9 is a schematic view of an embodiment of a manufacturing system.

FIG. 9 illustrates an embodiment of manufacturing system 701 for a motor vehicle. Specifically, FIG. 9 illustrates an embodiment of a method of exchanging information between a manufacturer and a parts supplier. This method may be used for submitting acceleration data that can be used by the parts supplier to determine calibration settings for an air bag system, including a target time to fire value.

In one embodiment, manufacturing system 701 comprises manufacturer computer 700 in communication with supplier 702 by way of network 704. Generally, computer 700 may be any type of computer, including either a desktop or a laptop computer. In other embodiments, manufacturer computer 700 may be any type of device that includes a display, a processor, and the ability to transmit and receive data from a remote network. Examples of such devices include, but are not limited to, PDA's, cell phones, as well as other types of devices.

In one embodiment, network 704 is configured to relay information between manufacturer computer 700 and supplier 702. Generally, network 704 may be a system allowing for the exchange of information between manufacturer computer 700 and supplier 702. Examples of such networks include, but are not limited to, personal area networks, local area networks, wide area networks, client-server networks, peer-to-peer networks, as well as other types of networks. Additionally, the network may support wired transmissions, wireless transmissions, or both wired and wireless transmissions. In some embodiments, network 704 may be a packet-switched communications system. In one embodiment, network 704 may be the Internet.

In some embodiments, information and/or data can be exchanged between manufacturer computer 700 and supplier 702 using methods other than a network. In some cases, information and/or data can be transferred using any computer readable medium. For example, in an alternative embodiment, a disc with information and/or data can be exchanged between manufacturer computer 700 and supplier 702.

Figure 10:
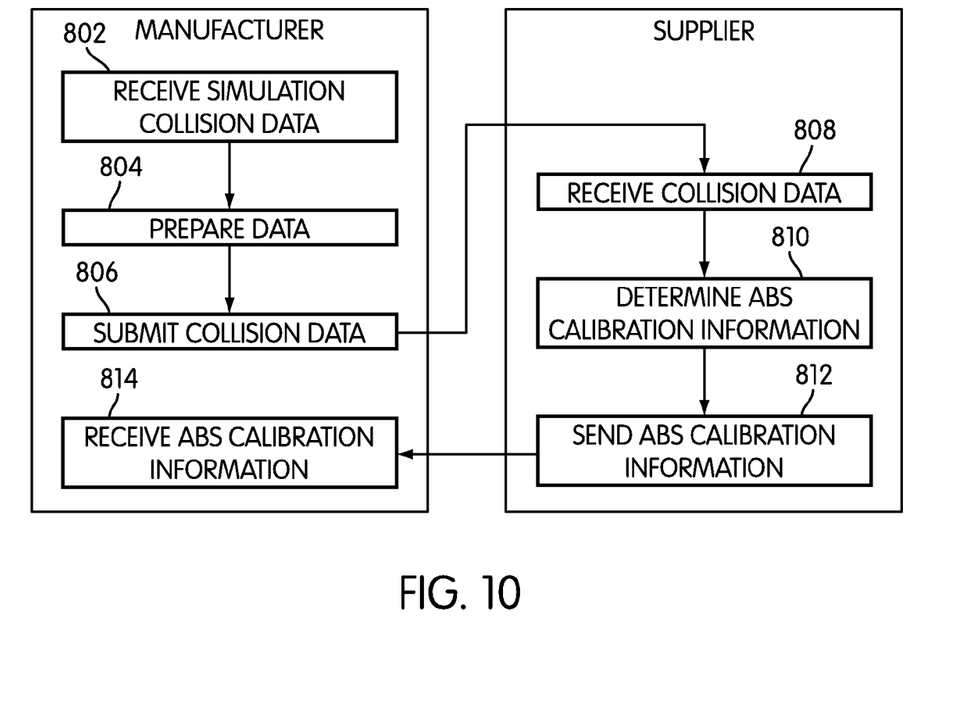
FIG. 10 is a schematic view of an embodiment of a process for determining calibration information for a motor vehicle system.

FIG. 10 illustrates a process for determining an air bag system calibration. In some cases, some of these steps may be performed by a manufacturer.

In this embodiment, during step 802, simulation collision data, including acceleration data, is received at a computer associated with a manufacturer. In some cases, a simulated collision may be run using a manufacturer computer 700. In other cases, a simulated collision may be run on another computer and/or network of computers and then transferred to manufacturer computer 700.

Following step 802, the collision data may be prepared for a supplier, during step 804. In some cases, this preparation could involve formatting the collision data into a format that is accepted by the supplier. In other cases, this preparation could involve filtering the data in some manner. In still other cases, the data could be prepared in any other manner known in the art.

Following step 804, during step 806, the collision data may be submitted to supplier 702. As previously discussed, the collision data could be transferred via a network, or through a computer readable medium that is physically exchanged between the manufacturer and the supplier. At this point, during step 808, supplier 702 may receive the collision data.

After step 808, during step 810, supplier 702 may determine calibration information for the air bag system. In particular, in some cases, supplier 702 may determine a target time to fire value. In some cases, supplier 702 may run a simulation of a collision using the collision data provided by the manufacturer in order to determine calibration information.

Following step 810, during step 812, supplier 702 may send the air bag system calibration information back to manufacturer computer 700. Following this, the manufacturer receives the air bag system calibration information during step 814.

Figure 11:
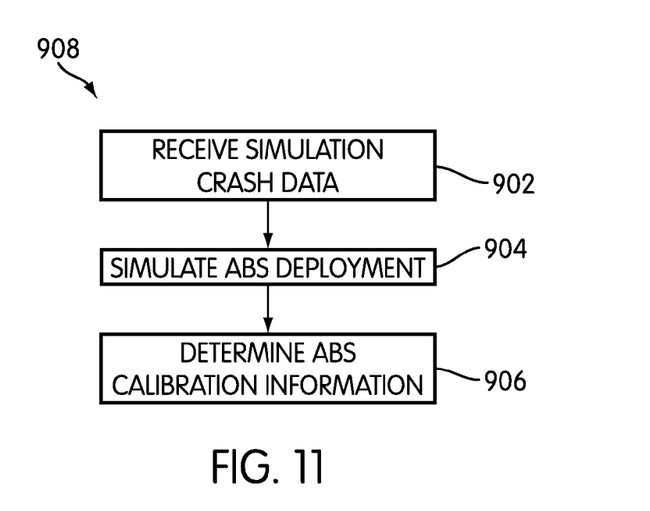
FIG. 11 is a schematic view of an embodiment of a process for determining calibration information for a motor vehicle system.

FIG. 11 illustrates an alternative embodiment of a process for determining air bag system calibration information. In this alternative embodiment, the step of determining calibration information for an air bag system is accomplished by the manufacturer. In other words, in this alternative embodiment, the process of calibrating an air bag system is performed without interacting with a supplier.

During a first step 902, the collision data may be received from a simulation system. Following this, during step 904, the manufacturer may simulate deployment of the air bag system using the collision data. In some cases, the manufacturer may run a simulation that uses the collision data in order to determine a calibration of the air bag system. At this point, during step 906, the manufacturer may determine the calibration information for the air bag system according to information received from the air bag deployment simulation.

Figure 12:
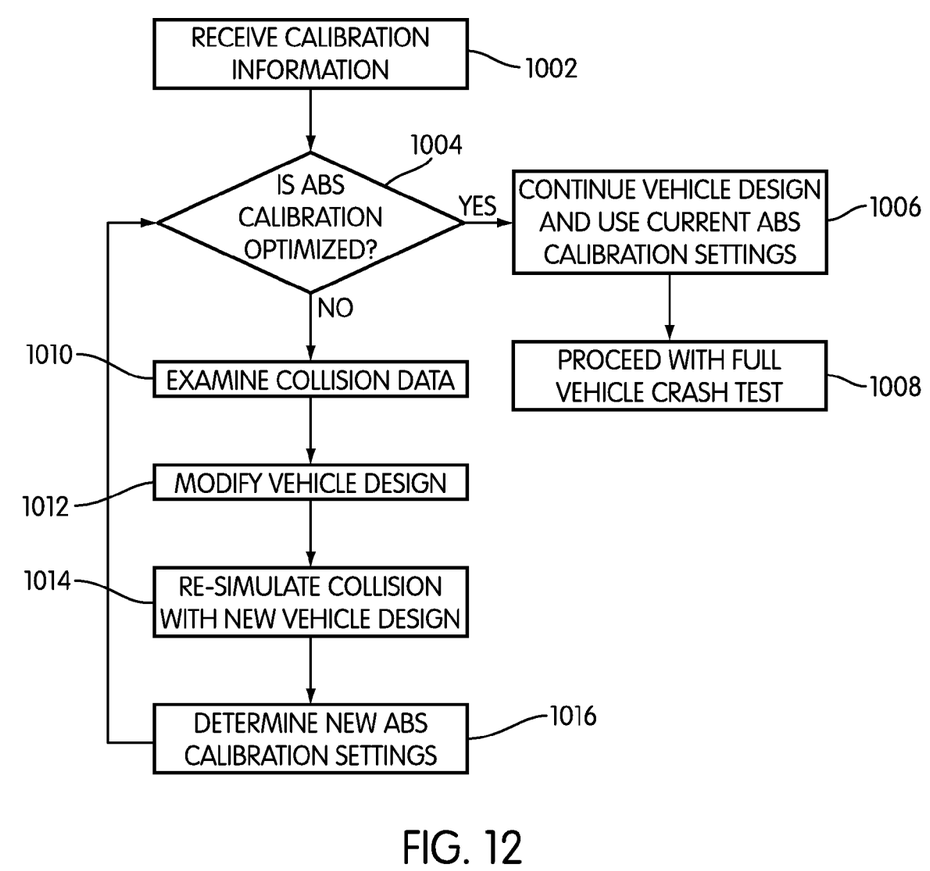
FIG. 12 is a schematic view of an embodiment of a process for determining calibration information for a motor vehicle system.

FIG. 12 is an embodiment of a process for modifying the design of one or more portions of a vehicle in order to optimize the target time to fire value. During a first step 1002, the calibration information is received. In some cases, the calibration data can be received from a supplier. In other cases, the calibration data can be determined directly by the manufacturer.

Next, during step 1004, the manufacturer may determine if the ABS calibration is optimized. In some cases, the ABS calibration is optimized if the target time to fire is below a given threshold. In other cases, different criteria can be used to determine if the ABS calibration is optimized. If the manufacturer determines that the ABS calibration is optimized, the manufacturer may proceed to step 1006. During step 1006, the manufacturer may continue with the current vehicle design and employ the current ABS calibration settings in the motor vehicle. At this point, during step 1008 the manufacturer may proceed with a full scale vehicle crash test. In other words, the manufacturer may build a vehicle according to the current vehicle design and using the current ABS calibration settings. This vehicle may then be crashed to determine if the desired safety requirements are met.

If, during step 1004, the manufacturer determines that the ABS calibration is not optimized, the manufacturer may proceed to step 1010. In some cases, if the target time to fire is above a predetermined threshold, the manufacturer may determine that the ABS calibration is not optimized. In other cases, other criteria may used to determine when the ABS calibration is not optimized.

During step 1010, the manufacturer may examine the collision data. In some cases, the manufacturer may run the simulated collision and examine very small time intervals to determine when various portions of the model deform during the simulation. In some cases, this examination can provide information about possible design modifications.

Next, during step 1012, the manufacturer may modify the vehicle design and the corresponding computer model. In some cases, the manufacturer may change the size and/or geometry of one or more portions. In other cases, the manufacturer may add and/or remove various portions.

Following step 1012, during step 1014, the manufacturer may re-simulate the collision with the modified computer model design. After this, during step 1016, the manufacturer may determine the new ABS calibration settings. In particular, in some cases, the manufacturer may determine the target time to fire. This may be accomplished by the manufacturer directly, or by a supplier, as previously discussed. Finally, once the new ABS calibration data has been determined, the manufacturer may proceed back to step 1004 to determine if the new ABS calibration data is optimized.

Figure 13:
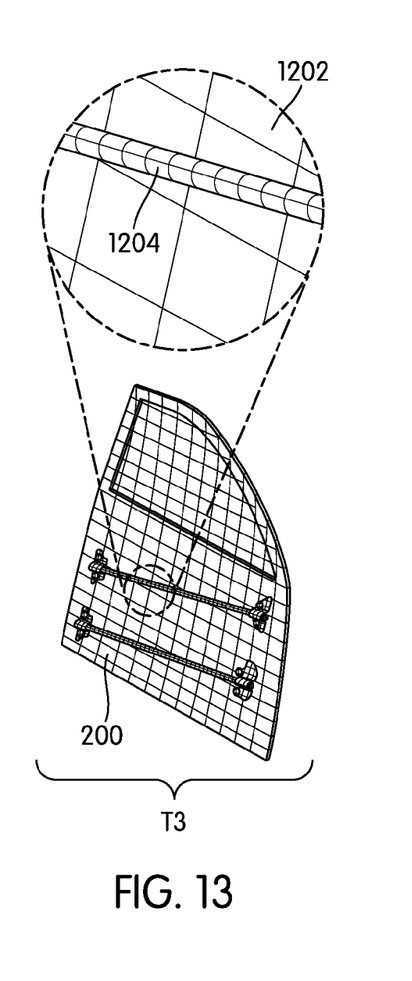
FIG. 13 is a schematic view of an embodiment of a step of a simulated collision.
Figure 14:
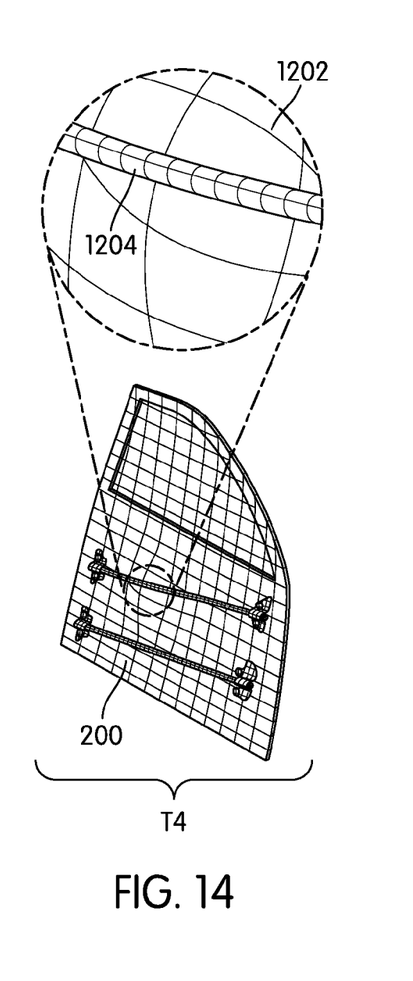
FIG. 14 is a schematic view of an embodiment of a step of a simulated collision.
Figure 15:
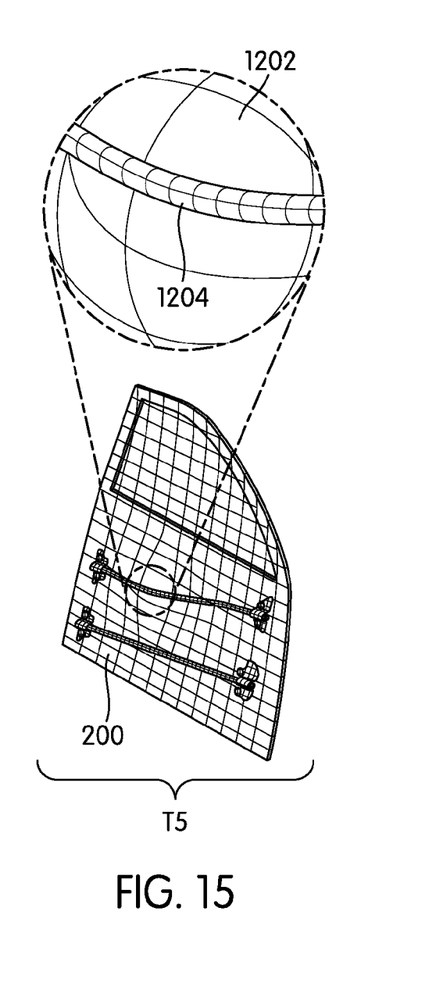
FIG. 15 is a schematic view of an embodiment of a step of a simulated collision.

FIGS. 13-15 illustrate a schematic embodiment of a method of examining collision data, as discussed in step 1010 of the process above. In some cases, by studying the collision data for a simulated collision, it may be possible to determine modifications for a computer model in order to achieve a predetermined level of calibration for a motor vehicle system. For example, in the exemplary embodiment discussed above, the collision data may be examined in order to determine which portions of the door of the computer model may require modifications in order to achieve a predetermined target time to fire. In some cases, the collision data can include visual information that represents images of a computer model during a collision. In particular, the collision data may include computer graphic information that displays the motion and deformation of various portions of the computer model during the collision.

Referring to FIGS. 13-15, the simulated collision between a pole and door 200 is shown. It should be understood that in the current embodiment, the pole is configured to collide with door 200 on an opposing outer portion of door 200, which is not visible in these Figures. In some cases, stepping through the collision data allows a manufacturer to determine if any modifications are necessary to optimize the calibration information. The term "stepping through", as used throughout this detailed description and in the claims, refers to a method of observing collision data at discrete time intervals. In this embodiment, the sequence of events occurring during the collision is monitored at time T3, time T4, and time T5 in order to further understand the collision.

A simulation system can include provisions for monitoring a sequence of events during a collision by decreasing the size of a time step of the simulation. The term "time step" as used throughout this detailed description and in the claims refers to a discrete amount of time that occurs between sequentially simulated events. In other words, the time step is the temporal resolution of a simulation. By varying the value of the time step of a simulation, the effects of a collision can be studied in greater detail.

In different embodiments, the time step associated with a step in a simulation may vary. For example, in some embodiments, a simulation system can have small time steps of approximately 1 millisecond. In other embodiments, the time step may have a value of in the range between 0.01 milliseconds and 1 millisecond. In one exemplary embodiment, the time step may have a value of approximately 0.5 milliseconds. In still other embodiments, the time step may have a value greater than 1 millisecond.

In an exemplary embodiment, the difference between adjacent time values is approximately 0.5 milliseconds. In other words, the time step of the simulation system is 0.5 milliseconds. Therefore, time T4 occurs 0.5 milliseconds after time T3. Likewise, time T5 occurs 0.5 milliseconds after time T4. With this arrangement, a manufacturer can determine how various structures deformed during a collision. This may allow a manufacturer to determine how a motor vehicle can be modified in order to achieve an optimized calibration for an air bag system.

Referring to FIG. 13, at time T3, door 200 is at rest and is not experiencing any accelerations or forces. Referring to FIG. 14, at time T4, as a pole impacts door 200, body panel 1202 may be slightly deformed. However, at this point, cross beam 1204 has not experienced any accelerations or forces. Referring to FIG. 15, at time T5, both body panel 1202 and cross beam 1204 experience accelerations and forces. In particular, both body panel 1202 and cross beam 1204 are deformed as the pole continues to impact door 200.

Using the information illustrated graphically in FIGS. 13 through 15, a manufacturer could determine possible modifications to computer model 102 that would help to optimize the target time to fire for the air bag system. In some cases, the timing and types of deformation experienced by body panel 1202 and cross beam 1204 may allow an engineer to determine how the geometry and material compositions of body panel 1202 and cross beam 1204 affect the target time to fire. By making suitable modifications to the geometry and/or material composition of one or more portions of a door, the target time to fire can be optimized.

After studying the collision data, a manufacturer may modify one or more portions of the computer model or one or more meshes, i.e. structural components, in order to optimize the target time to fire for the air bag system. In some cases, modifications can be made to the shape and/or size of one or more portions of the computer model. In other cases, one or more portions can be removed from the computer model. In still other cases, one or more portions can be added to the computer model.

At this point, the manufacturer may simulate a new collision with the modified computer model in order to generate a new set of collision data. This new set of collision data can then be used to determine a new target time to fire. This cycle of simulating a collision, generating calibration information from the collision data and modifying the computer model according to the collision data and the calibration information can be repeated any number of times until the target time to fire has been optimized.

Figure 16:
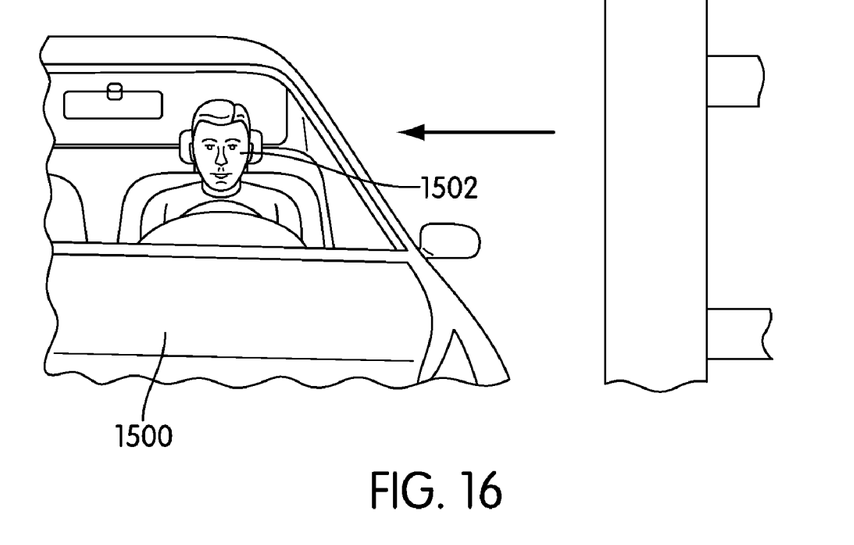
FIG. 16 is a schematic view of an embodiment of a motor vehicle crash test.
Figure 17:
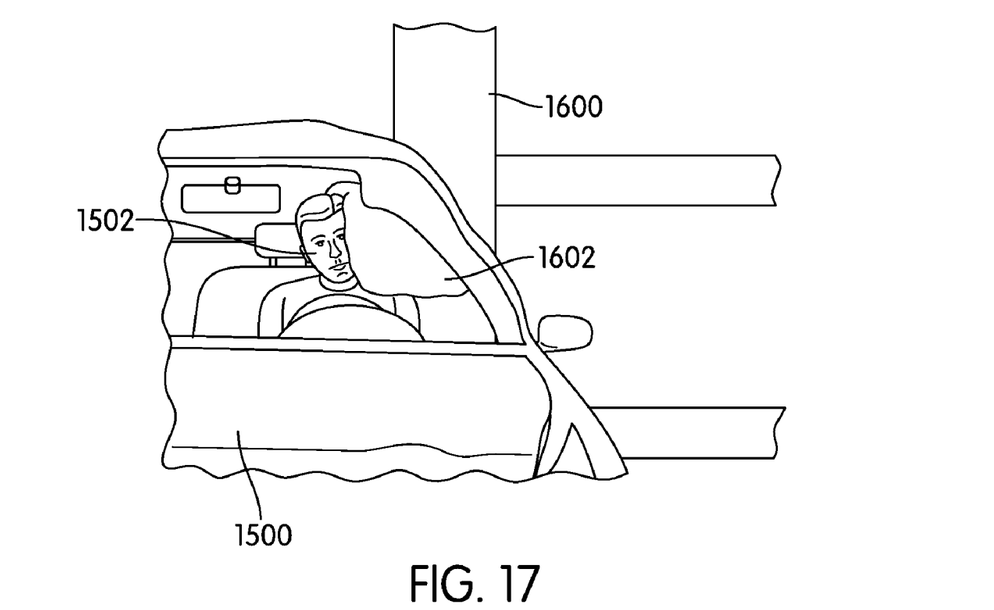
FIG. 17 is a schematic view of an embodiment of a motor vehicle crash test.

After the desired target time to fire has been achieved, a manufacturer may proceed to conducting a full scale crash test to ensure proper operation of the air bag system. FIGS. 16 and 17 illustrate an embodiment of a full scale vehicle crash test. Referring to FIG. 16, motor vehicle 1500 is at rest with crash dummy 1502 disposed in a driver position. Referring to FIG. 17, as pole 1600 collides with motor vehicle 1500, air bag system 1602 may deploy. In an exemplary embodiment, air bag system 1602 has been calibrated in order to achieve a predetermined target time to fire. With this arrangement, air bag system 1602 may be configured to fire within the desired target time to fire range to help prevent injury to an occupant.

The method discussed here for optimizing calibration information can be applied to any motor vehicle system and need not be restricted to use with airbag systems. Using the methods described above, a manufacturer can optimize the calibration information for any system that may be active during a collision. Furthermore, by using a simulation system to generate collision data, the calibration information can be determined without requiring multiple crash tests to be performed, which can greatly decrease manufacturing costs and time.

While various embodiments of the invention have been described, the description is intended to be exemplary, rather than limiting and it will be apparent to those of ordinary skill in the art that many more embodiments and implementations are possible that are within the scope of the invention. Accordingly, the invention is not to be restricted except in light of the attached claims and their equivalents. Also, various modifications and changes may be made within the scope of the attached claims.

We claim:

1. A method of designing a motor vehicle, comprising the steps of:
    simulating a motor vehicle collision using a computer model representing a design of the motor vehicle;
    receiving collision data from the simulated collision;
    receiving calibration information for an air bag system for the motor vehicle, the calibration information being determined from the collision data;
    performing a cycle of the following steps until optimized calibration information is obtained:
        modifying the computer model according to the calibration information, wherein the modified computer model represents a modified design of the motor vehicle,
        re-simulating the motor vehicle collision using the modified computer model,
        receiving modified collision data from the re-simulated collision, and
        receiving modified calibration information for the air bag system for the motor vehicle, the modified calibration information being determined from the modified collision data.

2. The method according to claim 1, wherein the computer model comprises a plurality of finite elements.

3. The method according to claim 1, wherein the step of receiving collision data from the simulated collision includes a step of receiving acceleration data from at least one predetermined sensor location.

4. The method according to claim 3, wherein the acceleration data from the at least one predetermined sensor location is used to determine acceleration data at a door of the computer model.

5. The method according to claim 1, wherein the calibration information is received from a supplier that manufactures the motor vehicle system.

6. The method according to claim 1, wherein the calibration information is optimized if a target time to fire of the air bag system is below a given threshold.

7. A method of designing a motor vehicle, comprising the steps of:
    simulating a motor vehicle collision using a computer model representing a design of the motor vehicle;
    receiving collision data from the simulated collision;
    determining a calibration setting of an air bag system for the motor vehicle, the calibration setting being determined from the collision data;
    modifying the computer model to represent a modified design of the motor vehicle and repeating the preceding steps until a determined calibration setting is optimized.

8. The method according to claim 7, wherein the collision data includes acceleration information.

9. The method according to claim 7, wherein the collision data is associated with at least one predetermined sensor region that corresponds to the location of a sensor on a motor vehicle.

10. The method according to claim 7, wherein the calibration setting is a target time to fire of the air bag system and wherein the determined calibration setting is optimized if the target time to fire is below a given threshold.

11. The method according to claim 7, wherein modifying the computer model comprises:
displaying a first still computer graphic image of the computer model at a first time of the simulated collision;
displaying a second still computer graphic image of the computer model at a later second time of the simulated collision, wherein the first and second still graphic images display motion and deformation of the computer model; and
receiving a modification of a structural vehicle component of the computer model that modifies the motion and deformation of the computer model, the collision data, and the calibration setting determined from the collision data.

12. The method according to claim 11, wherein the modification of the computer model comprises a modification of at least one of a geometry and a material composition of a vehicle component.

13. The method according to claim 11, wherein a time step between the first and second still graphic images is in the range between 0.01 milliseconds and 1 millisecond.

14. A method of designing a motor vehicle, comprising the steps of:
simulating a motor vehicle collision using a computer model representing a design of the motor vehicle;
receiving collision data from the simulated collision;
receiving calibration information for an air bag system for the motor vehicle, the calibration information being determined from the collision data;
performing a cycle of the following steps until optimized calibration information is obtained:
stepping through the collision data to determine at least one modification to the computer model according to the calibration information,
modifying the computer model to create a modified computer model, wherein the modified computer model represents a modified design of the motor vehicle,
re-simulating the motor vehicle collision using the modified computer model,
receiving modified collision data from the re-simulated collision, and
receiving modified calibration information for the air bag system for the motor vehicle, the modified calibration information being determined from the modified collision data.

15. The method according to claim 14, wherein the collision data is received at a first predetermined sensor region and a second predetermined sensor region.

16. The method according to claim 15, wherein the acceleration information from the first predetermined sensor region and the second predetermined sensor region is used to determine acceleration information at a predetermined location of the computer model.

17. The method according to claim 16, wherein the predetermined location is spaced away from the first predetermined sensor region and the second predetermined sensor region.

18. The method according to claim 14, wherein the step of modifying the computer model comprises at least one of modifying the shape of a portion of the computer model, removing a portion from the computer model, and adding a portion to the computer model.

19. The method according to claim 14, wherein stepping through the collision data comprises displaying successive still graphic images of the computer model taken at discrete time intervals from the simulated collision between an initial impact and an end of the motor vehicle collision.

20. The method according to claim 14, wherein stepping through the collision data and modifying the computer model comprise:
displaying a first still computer graphic image of the computer model at a first time of the simulated collision;
displaying a second still computer graphic image of the computer model at a later second time of the simulated collision, wherein the first and second still graphic images display motion and deformation of the computer model; and
receiving a modification of the computer model that modifies a target time to fire for the air bag system.

21. A method of designing a motor vehicle, comprising the steps of:
simulating a motor vehicle collision using a computer model representing a design of the motor vehicle;
receiving collision data from the simulated collision;
determining optimized sensor locations according to the collision data;
determining a calibration setting of an air bag system for the motor vehicle, the calibration setting being determined from the collision data; and
modifying the computer model to represent a modified design of the motor vehicle and repeating the preceding steps until a determined calibration setting is optimized.

22. The method according to claim 21, wherein the step of determining optimized sensor locations is followed by a step of applying sensor regions to the computer model according to the optimized sensor locations.

23. The method according to claim 22, wherein the step of applying sensor regions is followed by steps of re-simulating the motor vehicle collision in order to determine calibration information for a motor vehicle system.

* * * * *